US012642006B2

(12) United States Patent
Chen et al.

(10) Patent No.: US 12,642,006 B2
(45) Date of Patent: May 26, 2026

(54) MAGNETIC MEMORY DEVICE

(71) Applicant: UNITED MICROELECTRONICS CORP., Hsin-Chu City (TW)

(72) Inventors: Kuan-Hsiang Chen, Nantou County (TW); Yi-Ching Wang, Taichung City (TW); Wei Chen, Tainan City (TW); Chia-Fu Cheng, Taipei City (TW); Chun-Yao Yang, Kaohsiung City (TW)

(73) Assignee: UNITED MICROELECTRONICS CORP., Hsin-Chu City (TW)

(*) Notice: Subject to any disclaimer, the term of this patent is extended or adjusted under 35 U.S.C. 154(b) by 358 days.

(21) Appl. No.: 18/236,923

(22) Filed: Aug. 22, 2023

(65) Prior Publication Data

US 2025/0017117 A1    Jan. 9, 2025

(30) Foreign Application Priority Data

Jul. 3, 2023    (CN) .......................... 202310802331.6

(51) Int. Cl.
*H10B 61/00*        (2023.01)
*H10N 50/01*        (2023.01)
*H10N 50/20*        (2023.01)
*H10N 50/80*        (2023.01)
*H10N 50/85*        (2023.01)

(52) U.S. Cl.
CPC ............. *H10N 50/80* (2023.02); *H10B 61/00* (2023.02); *H10N 50/01* (2023.02); *H10N 50/20* (2023.02); *H10N 50/85* (2023.02)

(58) Field of Classification Search
CPC ........ H10N 50/80; H10N 50/01; H10N 50/20; H10N 50/85; H10N 50/10; H10B 61/00
See application file for complete search history.

(56) References Cited

U.S. PATENT DOCUMENTS

| | | | | |
|---|---|---|---|---|
| 7,211,447 | B2 | 5/2007 | Horng | |
| 8,378,330 | B2 | 2/2013 | Horng | |
| 8,946,834 | B2 | 2/2015 | Wang | |
| 9,601,687 | B2 | 3/2017 | Park | |
| 11,342,496 | B2 * | 5/2022 | Hsu | H10N 50/80 |
| 2006/0042929 | A1 | 3/2006 | Mauri | |
| 2021/0005809 | A1 * | 1/2021 | Ma | G01R 33/098 |
| 2021/0184101 | A1 * | 6/2021 | Lee | H10N 50/10 |

* cited by examiner

*Primary Examiner* — David Vu
(74) *Attorney, Agent, or Firm* — Winston Hsu

(57) ABSTRACT

A magnetic memory device includes a magnetic tunneling junction (MTJ) stack and a capping layer on the MTJ stack. The MTJ stack includes a reference layer, a tunneling barrier layer on the reference layer, and a free layer on the tunneling barrier layer. The capping layer includes a metal under layer that is in direct contact with the free layer, an oxide capping layer on the metal under layer, and a metal protection layer on the oxide capping layer.

9 Claims, 4 Drawing Sheets

MAGNETIC MEMORY DEVICE

BACKGROUND OF THE INVENTION

1. Field of the Invention

The present invention generally relates to a magnetic memory device. More particularly, the present invention relates to a magnetoresistive random access memory (MRAM) including a cap layer with a multilayer structure.

2. Description of the Prior Art

A magnetoresistive random access memory (MRAM) is a kind of non-volatile memory that has drawn a lot of attention in this technology field recently regarding its potentials of incorporating advantages of other kinds of memories. For example, a MRAM device may have an operation speed comparable to SRAMs, the non-volatile feature and low power consumption comparable to flash, the high integrity and durability comparable to DRAM. More important, the process for forming a MRAM device may be conveniently incorporated into existing semiconductor manufacturing processes.

A typical MRAM cell structure usually includes a memory stack structure including a magnetic tunneling junction (MTJ) stack disposed between the lower and upper electrodes. Unlike conventional memories that store data by electric charge or current flow, an MRAM cell stores data by applying external magnetic fields to control the magnetic polarity and tunneling magnetoresistance (TMR) of the MTJ. A well-controlled TMR of an MRAM cell is critical for the MRAM cell to function properly. How to improve the thermal stability, reliability and data retention time of a MRAM device are also important research topics in the field.

SUMMARY OF THE INVENTION

The present invention is directed to provide a magnetic memory device, of which the memory stack structure is able to achieve a stronger perpendicular magnetic anisotropy (PMA) and a higher tunneling magnetoresistance (TMR). Furthermore, the memory stack structure of the magnetic memory device provided by the present invention has higher resistance to impurity diffusion, so that problems such as unstable TMR due to diffusion of impurity into the MTJ may be eliminated. Overall, the thermal stability, reliability and data retention time of the magnetic memory device provided by the present invention may be improved.

According to an embodiment of the present invention, a magnetic memory device includes a magnetic tunneling junction (MTJ) stack and a capping layer on the MTJ stack. The MTJ stack includes a reference layer, a tunneling barrier layer on the reference layer, and a free layer on the tunneling barrier layer. The capping layer includes a metal under layer that is in direct contact with the free layer, an oxide capping layer on the metal under layer, and a metal protection layer on the oxide capping layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
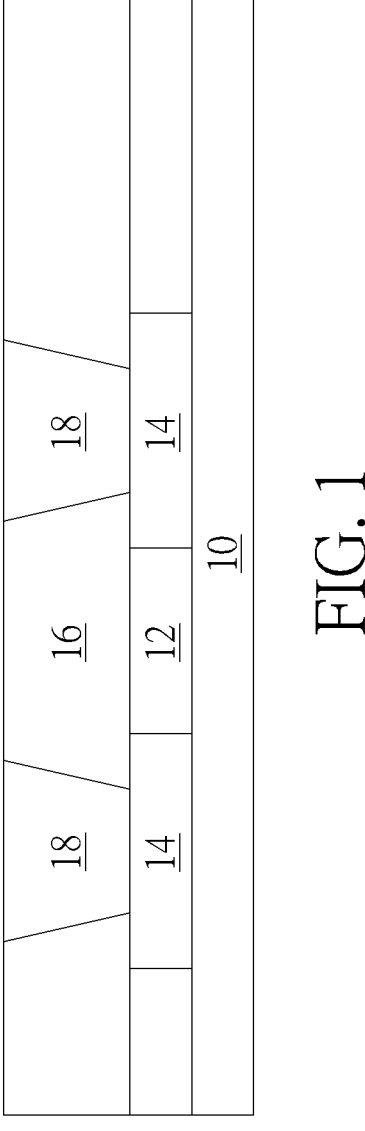
FIG. 1 to FIG. 4 are schematic cross-sectional views of a magnetic memory device at different steps of a manufacturing process according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. Relative dimensions and proportions of parts of the drawings have been shown exaggerated or reduced in size, for the sake of clarity and convenience in the drawings. The same reference signs are generally used to refer to corresponding or similar features in modified and different embodiments. These embodiments are described in sufficient detail to enable those skilled in the art to practice the invention. Other embodiments may be utilized and that structural, logical and electrical changes may be made without departing from the spirit and scope of the present invention.

Please refer to FIG. 1 to FIG. 4, which are schematic cross-sectional views showing a magnetic memory device at different steps of a manufacturing process according to an embodiment of the present invention. As shown in FIG. 1, a substrate 10 is provided. The substrate 10 may be a silicon substrate, a silicon-on-insulator (SOI) substrate, or a Group III-V semiconductor substrate, but is not limited thereto. The substrate 10 may include semiconductor devices formed therein, such as transistors, capacitors, resistors, inductors, or other active or passive semiconductor devices, which are not shown in the diagrams for the sake of simplification.

At least a dielectric layer and interconnect structures formed in the dielectric layer may be formed on the substrate 10. For example, as shown in FIG. 1, a dielectric layer 12 and a dielectric layer 16 may be sequentially formed on the substrate 10. A plurality of interconnect structures (such as metal interconnect structures) 14 may be formed in the dielectric layer 12. A plurality of interconnect structures interconnect structures (such as contact vias) 18 may be formed in the dielectric layer 16 and in direct contact with the interconnect structures 14. The dielectric layer 12 and the dielectric layer 16 respectively include silicon oxide $(SiO_2)$ or a suitable low-k dielectric material such as fluorinated silica glass (FSG), silicon oxycarbide (SiCOH), spin-on-glass, porous low-k dielectric material, organic dielectric polymers, or a combination thereof, but is not limited thereto. The interconnect structures 14 and the interconnect structures 18 respectively include a conductive metal or a metal compound, such as tungsten (W), copper (Cu), aluminum (Al), titanium (Ti), tantalum (Ta), titanium nitride (TiN), tantalum nitride (TaN), or a combination thereof, but is not limited thereto.

Subsequently, as shown I FIG. 2, a stack structure is formed on the substrate 10. The stack structure 100 may include (sequentially from the bottom that is closer to the substrate 10 to the top that is away from the substrate 10) a bottom electrode layer BE, a magnetic tunneling junction (MTJ) stack 20, a capping layer CAP, and a hard mask layer 40. The stack structure may be subjected to an anneal process P1 to improve crystallization and interface quality, and determine the magnetic anisotropy direction of the MTJ stack 20. According to an embodiment of the present invention, the temperature of the anneal process P1 may be between 350° C. and 450° C., and a processing time of the anneal process P1 may be between 30 minutes and 5 hours, but is not limited thereto.

The bottom electrode layer BE is disposed on the dielectric layer 16 and directly contacts the interconnect structures 18. The bottom electrode layer BE may include a conductive metal or a metal compound, such as titanium (Ti), tantalum (Ta), titanium nitride (TiN), tantalum nitride (TaN), or a combination thereof, but is not limited thereto.

The MTJ stack 20 has a multilayer structure, including a seed layer 22 at the bottom, and a reference layer 24, a pinned layer 25, a tunneling barrier layer 26, and a free layer 28 sequentially formed on the seed layer 22.

The seed layer 22 may control the crystal orientation of the layers formed thereon to improve the interface quality of the MTJ stack 20. The seed layer 22 may have a single layer structure or a multi-layer structure, wherein the material of each layer may be selected from a group comprising magnesium oxide (MgO), cobalt iron boron (CoFeB), cobalt chromium (CoCr), cobalt tantalum (CoTa), cobalt titanium (CoTi), cobalt vanadium (CoV), tantalum (Ta), iridium (Ir), hafnium (Hf), tungsten (W), molybdenum (Mo), ruthenium (Ru), platinum (Pt), palladium (Pd), nickel chromium (NiCr), nickel tantalum (NiTa), nickel titanium (NiTi), nickel vanadium (NiV), tantalum nitride (TaN), or a combination of the above materials, but not limited thereto.

The reference layer 24 is used to pin or fix nearby ferromagnetic layers to a particular magnetic polarity. The reference layer 24 mainly includes an anti-ferromagnetic (AFM) material such as platinum manganese (PtMn), iridium manganese (IrMn), platinum iridium (PtIr), and other suitable anti-ferromagnetic materials or a combination thereof, but is not limited thereto.

The pinned layer 25 and the free layer 28 respectively include a ferromagnetic material, such as iron (Fe), cobalt (Co), nickel (Ni), iron nickel (FeNi), iron cobalt (FeCo), cobalt nickel (CoNi), iron boron (FeB), iron platinum (FePt), iron palladium (FePd), cobalt iron boron (CoFeB), and other suitable ferromagnetic materials or a combination thereof, but is not limited thereto. According to an embodiment of the present invention, the pinned layer 25 and the free layer 28 respectively include CoFeB. The magnetic polarity of the pinned layer 25 is pinned or fixed by the reference layer 24. The magnetic polarity of the free layer 28 may be changed by an external magnetic field to be parallel or antiparallel to the magnetic polarity of the pinned layer 25, so that a low TMR state (parallel) and a high TMR state (antiparallel) of the MTJ stack 20 may be obtained. The ratio of the difference between the resistances of the high TMR state and the low TMR state to the resistance of the low TMR state is referred to as the TMR ratio, wherein a higher TMR ratio provides a larger read margin, faster read speed, and better device reliability.

The tunneling barrier layer 26 is sandwiched between the pinned layer 25 and the free layer 28 and may include a metal oxide material such as magnesium oxide (MgO), aluminum oxide (AlO), nickel oxide (NiO), gadolinium oxide (GdO), tantalum oxide (TaO), molybdenum oxide (MoO), titanium oxide (TiO), tungsten oxide (WO), or a combination thereof, but is not limited thereto. According to an embodiment of the present invention, the tunneling barrier layer 26 preferably includes MgO to obtain a stronger PMA, higher magnetic density and higher TMR ratio at the interfaces with the pinned layer 25 and the free layer 28, such that an improved thermal stability, reliability and data retention time may be achieved. The reference layer 24, the pinned layer 25, the tunneling barrier layer 26 and the free layer 28 may respectively have a single layer or a multilayer structure, and each of them may have a thickness ranging from approximately several angstroms (Å) to tens of nanometers (nm).

The capping layer CAP is directly disposed on the MTJ stack 20. According to an embodiment of the present invention, the capping layer CAP includes a metal under layer 32, an oxide capping layer 34, and a metal protection layer 36. The oxide capping layer 34 may include a metal oxide material such as magnesium oxide (MgO), aluminum oxide (AlO), nickel oxide (NiO), gadolinium oxide (GdO), tantalum oxide (TaO), molybdenum oxide (MoO), titanium oxide (TiO), tungsten oxide (WO), or a combination thereof, but is not limited thereto. According to an embodiment of the present invention, the oxide capping layer 34 preferably includes MgO or TaO, or a combination thereof, so that a stronger PMA and a higher TMR ratio may be obtained. According to an embodiment of the present invention, the oxide capping layer 34 has a thickness ranging from 3 angstroms to 10 angstroms to better enhance the technical effect.

The metal under layer 32 is sandwiched between the oxide capping layer 34 and the free layer 28 of the MTJ stack 20, and is in direct contact with the free layer 28. The metal under layer 32 preferably includes a metal material with stronger spin orbit coupling (SOC) and lower electronegativity, such that the PMA and TMR ratio of the interface between the oxide capping layer 34 and the free layer 28. According to an embodiment of the present invention, the metal under layer 32 may include a heavy metal material such as tantalum (Ta), tungsten (W), hafnium (Hf), molybdenum (Mo), or a combination thereof, but is not limited thereto. According to an embodiment of the present invention, the metal under layer 32 preferably includes tantalum (Ta), which may also absorb excess boron (B) of the free layer 28 to promote crystallization of the free layer 28 during the annealing process P1. The metal under layer 32 is also used to block the diffusion of impurities (such as elements from the metal protection layer 36 and/or the hard mask layer 40) into the MTJ stack 20. According to an embodiment of the present invention, the metal under layer 32 has a thickness ranging from 3 angstroms to 5 angstroms to better enhance the technical effect.

The metal protection layer 36 may include a metal material with a good conductivity and being able to protect the underlying layers from being oxidized. According to an embodiment of the present invention, the metal protection layer 36 preferably includes ruthenium (Ru), which may react with oxygen (such as ambient oxygen) to form a dense ruthenium oxide (RuO) film on the surface. The surface RuO film may, in turn, block oxygen penetration, so that the underlying material layers may be well protected from being oxidized. More important, RuO also has good conductivity and would not cause adverse effect on the TMR. According to an embodiment of the present invention, the portion of the metal protection layer 36 near surface of the oxide capping layer 34 may include a metal material which may easily react with Ru to form an alloy to prevent the un-oxidized Ru from diffusing into the MTJ stack 20 and causing TMR shifting. The metal material may include vanadium (V), manganese (Mn), zinc (Zn), molybdenum (Mo), tantalum (Ta), tungsten (W), rhenium (Re), osmium (Os), but is not limited thereto.

5

Figure 2:
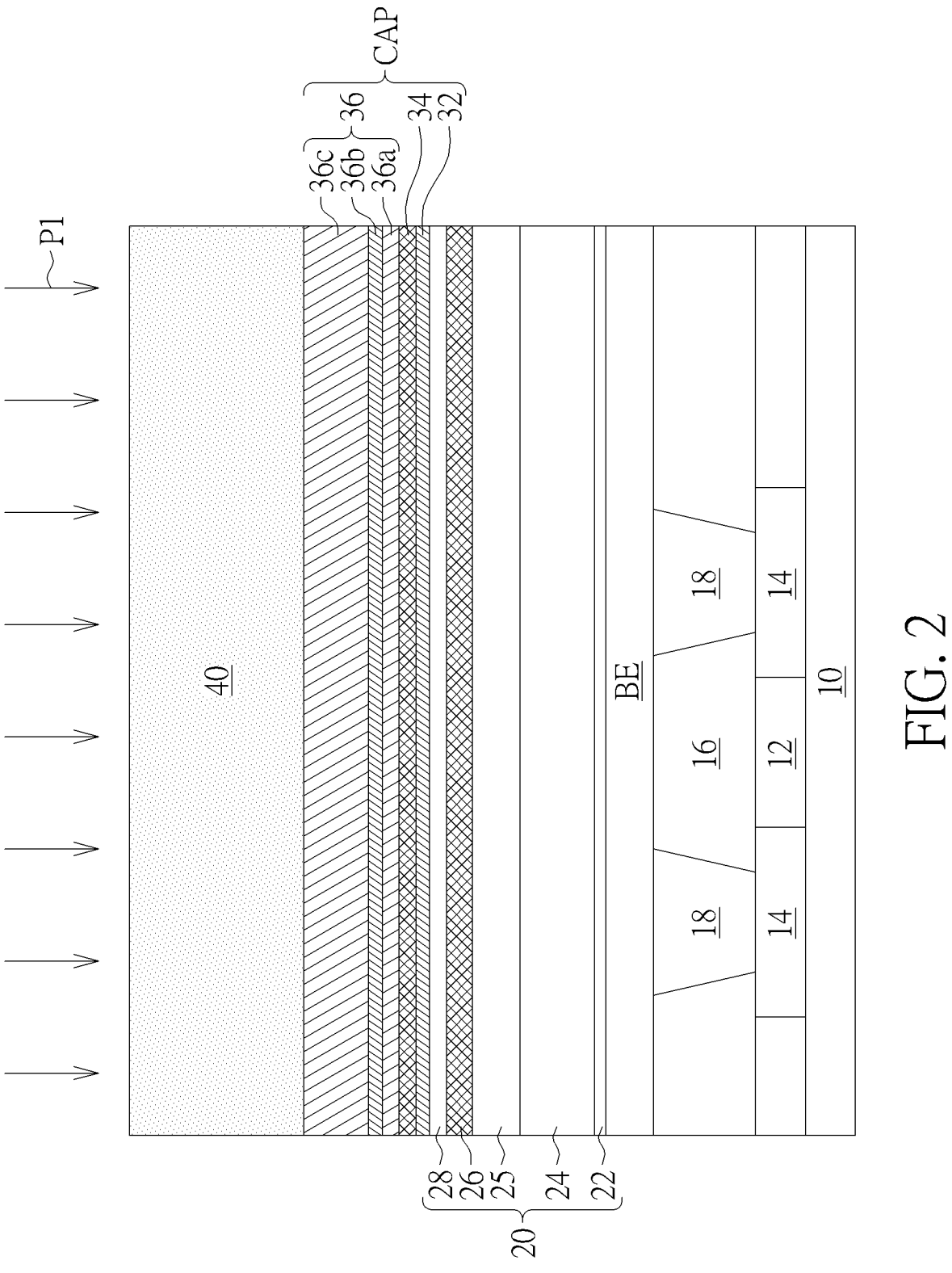

For example, as shown in FIG. 2, the metal protection layer 36 may be a composite layer formed by a first metal layer 36a, a second metal layer 36b and a third metal layer 36c. The first metal layer 36a and the third metal layer 36c are preferably made of Ru, wherein the first metal layer 36a (may be referred to as the lower Ru layer) is in direct contact with the upper surface of the oxide capping layer 34, and the third metal layer 36c (may be referred to as the upper Ru layer) is in direct contact with the bottom surface of the hard mask layer 40. The third metal layer 36c may have a thickness that is 2 to 10 times of the thickness of the first metal layer 36a. For example, the first metal layer 36a may have a thickness ranging from 3 angstroms to 10 angstroms, and the third metal layer 36c may have a thickness ranging from 10 to 100 angstroms. The second metal layer 36b is between the first metal layer 36a and the third metal layer 36c, and is preferably made of Ta (may be referred to as the middle Ta layer). The second metal layer 36b may have a thickness ranging from 3 angstroms to 10 angstroms, but is not limited thereto.

The hard mask layer 40 is disposed on the metal protection layer 36 and directly contacts the third metal layer 36c of the metal protection layer 36. The hard mask layer 40 may include a conductive metal or a metal compound, such as titanium (Ti), tantalum (Ta), titanium nitride (TiN), tantalum nitride (TaN), or a combination thereof, but is not limited thereto. According to an embodiment of the present invention, the hard mask layer 40 includes titanium nitride (TiN). The hard mask layer 40 may be used as an etch stop layer during the subsequent patterning process P2 (shown in FIG. 3) to protect the underlying layers. The hard mask layer 40 may also help to form memory cells MC (shown in FIG. 3) with more vertical sidewalls. Furthermore, the hard mask layer 40 is also used to form top electrodes of the memory cells MC.

Figure 3:
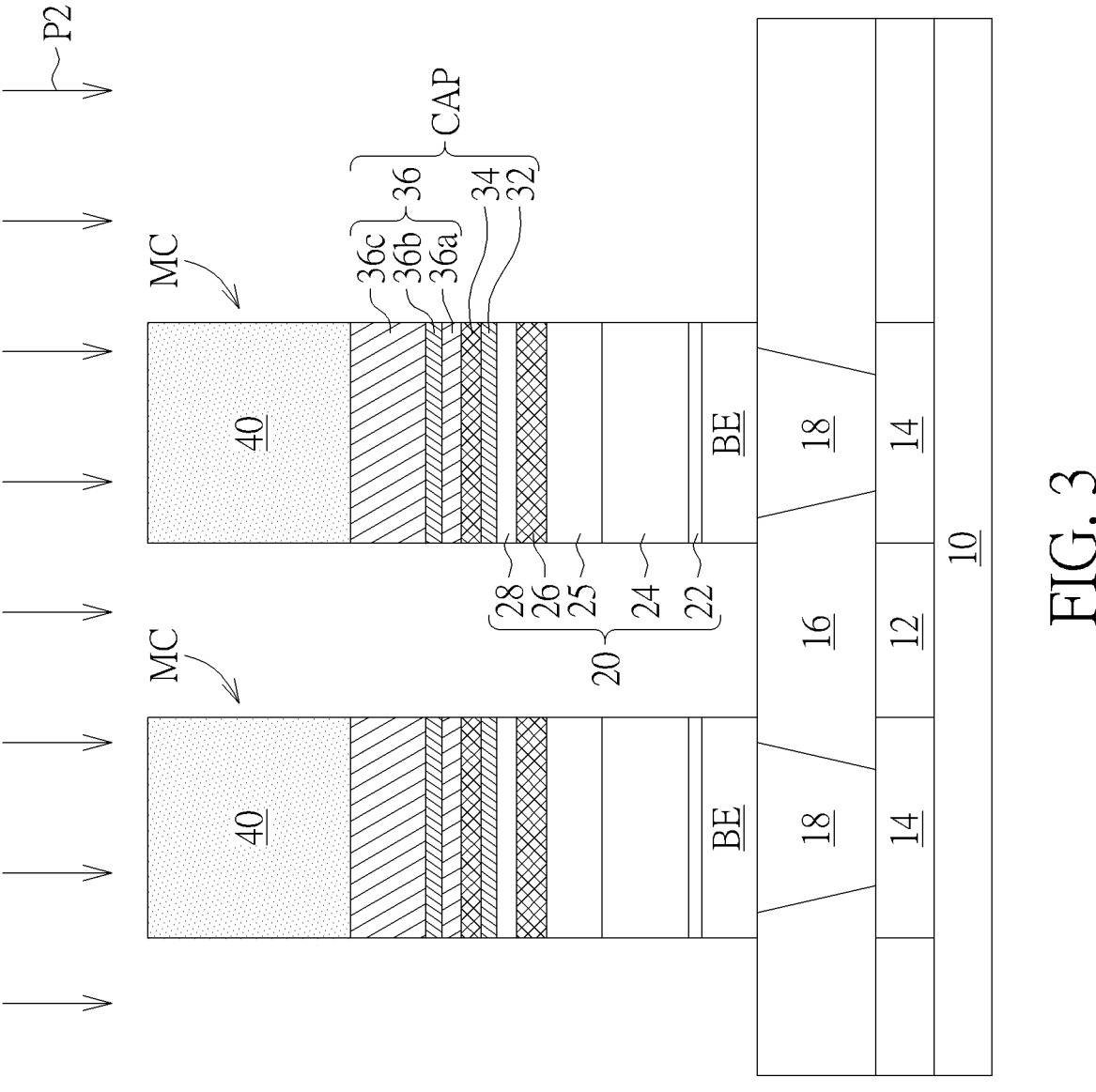

Please refer to FIG. 3. Following, a patterning process P2 (such as a photolithography-etching process) is performed to pattern the stack structure by removing the unnecessary portions of the bottom electrode layer BE, the MTJ stack 20, the capping layer CAP, and the hard mask layer 40, such that a plurality of memory cells MC are obtained. The memory cells MC are respectively disposed on the interconnect structures 18. The bottom electrode layer BE of each of the memory cells MC is in contact and electrically connected to one of the interconnection structure 18.

Figure 4:
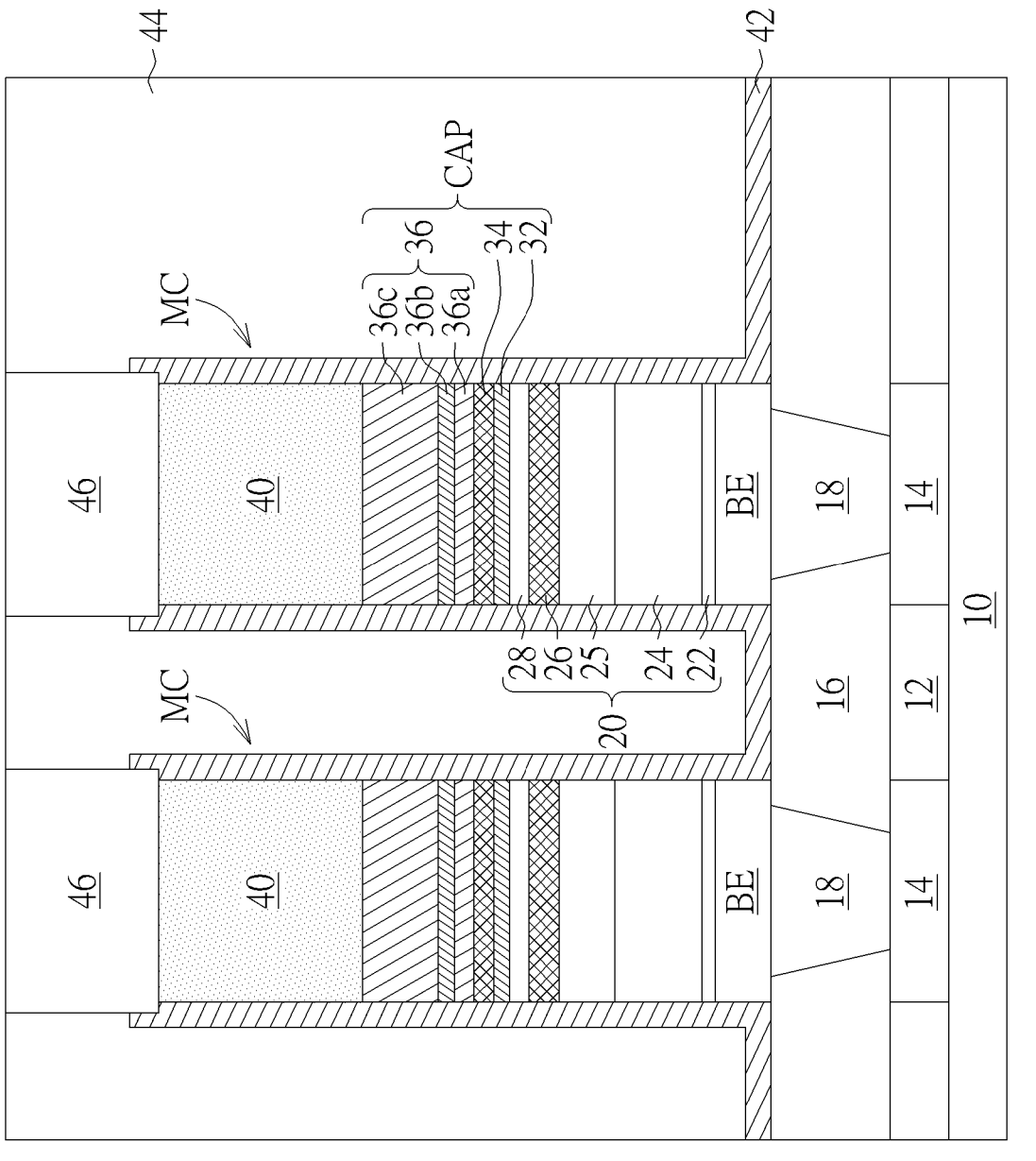

Please refer to FIG. 4. Subsequently, a passivation layer 42 may be formed on the substrate 10 to conformally cover the surface of the dielectric layer 16 and the top surfaces and sidewalls of the memory cells MC. Afterward, an interlayer dielectric layer 44 is formed on the passivation layer 42 in a blanket manner to cover the memory cells MC and completely fill the spaces between the memory cells MC. The passivation layer 42 may include an insulating material, such as silicon nitride (SiN), silicon oxynitride (SiON), or carbon nitride (SiCN), but is not limited thereto. The interlayer dielectric layer 44 may include silicon oxide (SiO$_2$) or a suitable low-k dielectric material such as fluorinated silica glass (FSG), silicon oxycarbide (SiCOH), spin-on-glass, porous low-k dielectric material, organic dielectric polymers, or a combination thereof, but is not limited thereto. Subsequently, a plurality of interconnect structures 46 may be formed on the memory cells 35, penetrating through the interlayer dielectric layer 44 and the passivation layer 42 to direct contact and electrically connect to the hard mask layers 40 (used as the top electrodes) of the memory cells MC. The interconnect structures 44 may include a conductive metal or a metal compound, such as tungsten (W), copper (Cu), aluminum (Al), titanium (Ti), tantalum (Ta), titanium nitride (TiN), tantalum nitride (TaN), or a combination thereof, but is not limited thereto.

Please continue to refer to FIG. 4, which shows a schematic cross-sectional view of a magnetic memory device according to an embodiment of the present invention. The memory cell MC of the magnetic memory device includes a stack structure including (sequentially from the bottom that is closer to the substrate 10 to the top that is away from the substrate 10) a bottom electrode layer BE, a MTJ stack 20, a capping layer CAP, and a hard mask layer 40. In detail, the MTJ stack 20 includes, from bottom to top, a seed layer 22, a reference layer 24, a pinned layer 25, a tunneling barrier layer 26, and a free layer 28. The capping layer CAP includes, from bottom to top, a metal under layer 32, an oxide capping layer 34, and a metal protection layer 36. The metal under layer 32 is sandwiched between the free layer 28 and the oxide capping layer 34, and the bottom surface and top surface of the metal under layer 32 are respectively in direct contact with the free layer 28 and the oxide capping layer 34. According to a preferred embodiment of the present invention, the metal under layer 32 is essentially made of Ta, the oxide capping layer 34 is essentially made of MgO, TaO, or a combination thereof, the metal protection layer 36 is a composite layer essentially formed by Ru and Ta layers. The stack structure with the above layers and materials may produce stronger perpendicular magnetic anisotropy (PMA) and more stable tunneling magnetoresistance (TMR), so that the thermal stability, reliability, and data retention time of the magnetic memory device may be significantly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic memory device, comprising:
a magnetic tunneling junction stack, comprising:
   a reference layer;
   a tunneling barrier layer on the reference layer; and
   a free layer on the tunneling barrier layer; and
a capping layer on the magnetic tunneling junction stack, and comprising:
   a metal under layer in direct contact with the free layer, wherein the metal under layer comprises Ta;
   an oxide capping layer on the metal under layer, wherein the oxide capping layer comprises MgO, TaO, or a combination thereof; and
   a metal protection layer on the oxide capping layer, and comprising:
      a lower Ru layer;
      a middle Ta layer on the lower Ru layer; and
      an upper Ru layer on the middle Ta layer, wherein the lower Ru layer is in direct contact with the oxide capping layer.

2. The magnetic memory device according to claim 1, wherein the tunneling barrier layer comprises MgO.

3. The magnetic memory device according to claim 1, wherein the reference layer and the free layer respectively comprise CoFeB.

4. The magnetic memory device according to claim 1, wherein the metal under layer has a thickness ranging from 3 angstroms to 5 angstroms.

5. The magnetic memory device according to claim 1, wherein the oxide capping layer has a thickness ranging from 3 angstroms to 10 angstroms.

6. The magnetic memory device according to claim 1, wherein the metal protection layer is a composite layer comprising Ru and Ta layers.

7. The magnetic memory device according to claim 1, wherein a thickness of the upper Ru layer is larger than a thickness of the lower Ru layer and the middle Ta layer.

8. The magnetic memory device according to claim 1, further comprising a hard mask layer on the capping layer and in direct contact with the metal protection layer.

9. The magnetic memory device according to claim 8, wherein the hard mask layer comprises TiN.

* * * * *